(12) United States Patent
Lee et al.

(10) Patent No.: US 9,208,894 B2
(45) Date of Patent: Dec. 8, 2015

(54) METHODS OF CHARGING AUXILIARY POWER SUPPLIES IN DATA STORAGE DEVICES SUBJECT TO POWER ON AND /OR HOT PLUGGING AND RELATED DEVICES

(75) Inventors: Sang-Geol Lee, Seoul (KR); Sang Hoon Song, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 564 days.

(21) Appl. No.: 13/231,353

(22) Filed: Sep. 13, 2011

(65) Prior Publication Data

US 2012/0117409 A1    May 10, 2012

(30) Foreign Application Priority Data

Nov. 8, 2010  (KR) .................. 10-2010-0110536

(51) Int. Cl.
| | |
|---|---|
| G06F 11/30 | (2006.01) |
| G11C 16/30 | (2006.01) |
| G06F 1/26 | (2006.01) |
| G06F 1/30 | (2006.01) |
| G11C 5/14 | (2006.01) |

(52) U.S. Cl.
CPC .................. G11C 16/30 (2013.01); G06F 1/26 (2013.01); G06F 1/30 (2013.01); G11C 5/147 (2013.01)

(58) Field of Classification Search
CPC ....................................................... G06F 1/30
USPC .................. 713/300, 340; 711/103; 714/14, 2
See application file for complete search history.

(56) References Cited

U.S. PATENT DOCUMENTS

| | | | |
|---|---|---|---|
| 7,107,480 B1 * | 9/2006 | Moshayedi | G06F 11/1441 714/2 |
| 7,227,803 B2 | 6/2007 | Lee et al. | |
| 7,305,572 B1 * | 12/2007 | Burroughs et al. | 713/300 |
| 7,802,121 B1 * | 9/2010 | Zansky | G06F 1/263 307/64 |
| 2005/0024968 A1 | 2/2005 | Lee et al. | |
| 2007/0245161 A1 * | 10/2007 | Shaw et al. | 713/300 |
| 2008/0028238 A1 * | 1/2008 | Lucas et al. | 713/300 |
| 2008/0126700 A1 | 5/2008 | El-Batal et al. | |
| 2009/0001948 A1 | 1/2009 | Martinez et al. | |
| 2009/0013198 A1 * | 1/2009 | Tanaka | G11C 5/14 713/300 |
| 2009/0300374 A1 * | 12/2009 | Mori | 713/300 |
| 2010/0133903 A1 * | 6/2010 | Rufer | F02C 6/16 307/22 |
| 2010/0146333 A1 * | 6/2010 | Yong | G06F 1/305 714/14 |
| 2010/0253413 A1 | 10/2010 | Wu | |
| 2010/0332858 A1 * | 12/2010 | Trantham et al. | 713/300 |
| 2010/0332863 A1 * | 12/2010 | Johnston | 713/300 |

(Continued)

FOREIGN PATENT DOCUMENTS

| | | |
|---|---|---|
| CN | 101542449 A | 9/2009 |
| CN | 101854059 A | 10/2010 |

(Continued)

Primary Examiner — Thomas Lee
Assistant Examiner — Aurel Prifti
(74) Attorney, Agent, or Firm — Myers Bigel Sibley & Sajovec, P.A.

(57) ABSTRACT

A method of operating a data storage device can be provided by receiving first power and second power at a data storage device, that includes a semiconductor memory, upon powering on of the data storage device or hot-plugging of the data storage device. The first power can be applied to the data storage device and the second power can be applied after a delay to an auxiliary power supply included in the data storage device based on when an inrush current, generated from applying the first power, occurred. Related devices are also disclosed.

19 Claims, 12 Drawing Sheets

(56) References Cited

U.S. PATENT DOCUMENTS

| | | | | |
|---|---|---|---|---|
| 2010/0332896 A1* | 12/2010 | Wilson | | G06F 1/30 714/14 |
| 2011/0066872 A1* | 3/2011 | Miller | | G06F 1/30 713/340 |
| 2011/0214001 A1* | 9/2011 | Liu | | 713/340 |
| 2011/0271036 A1* | 11/2011 | Cheng et al. | | 711/103 |
| 2012/0023351 A1* | 1/2012 | Wakrat et al. | | 713/322 |

FOREIGN PATENT DOCUMENTS

| | | |
|---|---|---|
| JP | 2005-261149 | 9/2005 |
| KR | 1020090086266 A | 8/2009 |
| KR | 1020100066000 A | 6/2010 |

\* cited by examiner (CONVENTIONAL)
Fig. 8
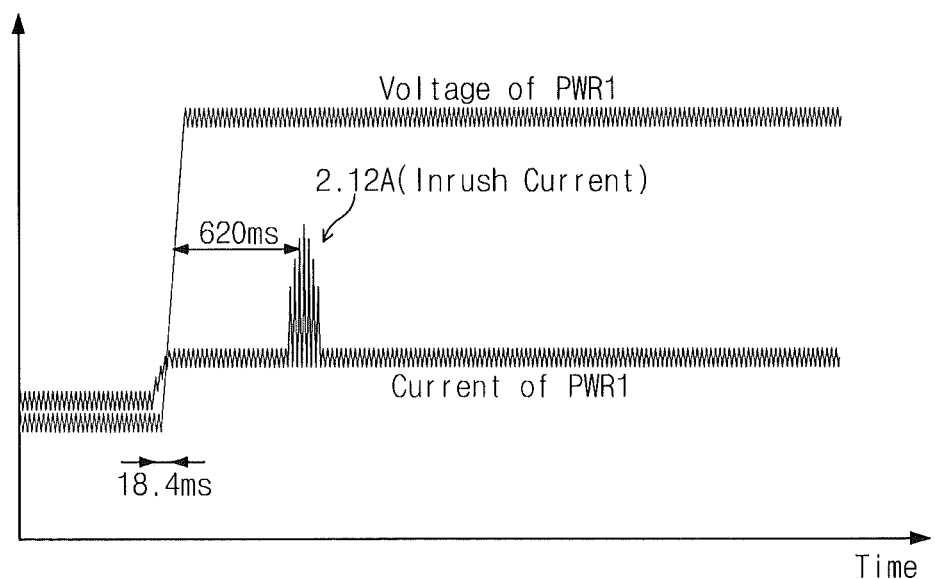

METHODS OF CHARGING AUXILIARY
POWER SUPPLIES IN DATA STORAGE
DEVICES SUBJECT TO POWER ON AND /OR
HOT PLUGGING AND RELATED DEVICES

CROSS-REFERENCE TO RELATED APPLICATIONS

This application claims the benefits, under 35 U.S.C §119, of Korean Patent Application No. 10-2010-0110536 filed Nov. 8, 2010, the entirety of which is incorporated by reference herein.

BACKGROUND

1. Field

Exemplary embodiments relate to the field of electronics, and more particularly, to semiconductor data storage devices.

2. Description of the Related Art

A data storage device, such as a solid state disk (SSD), has been used to replace a hard disk drive (HDD). Unlike an HDD, an SSD may include fewer mechanical components, and specifically, fewer moving components. An SSD can have reduced latency compared to an HDD, so that read and write operations may be performed at higher speeds.

SUMMARY

Embodiments according to the inventive concept can provide methods auxiliary power supplies in data storage devices and related devices. Pursuant to these embodiments, a method of operating a data storage device can be provided by powering on or hot plugging the data storage device that includes a semiconductor memory as a main storage unit. Power can be supplied to the data storage device and a charge operation of an auxiliary power supply of the data storage device, can be delayed and the auxiliary power supply can be charged after an inrush current is generated.

In some embodiments according to the inventive concept, the charging the auxiliary power supply can be performed after supplying power to internal elements of the data storage device ends. In some embodiments according to the inventive concept, a method of operating a data storage device can be provided by powering on or hot plugging the data storage device that includes a semiconductor memory as a main storage unit. A first power and a second power can be supplied to the data storage device and the first power can be supplied to internal elements of the data storage device. An auxiliary power supply can be charged with the second power after the second power is applied to the data storage device and a predetermined time elapses and power can be supplied from the auxiliary power supply to the internal elements of the data storage device upon a sudden loss of power to the data storage device.

In some embodiments according to the inventive concept, charging the auxiliary power supply is performed after an inrush current is generated. In some embodiments according to the inventive concept, charging the auxiliary power supply is performed after supplying power to the internal elements of the data storage device ends. In some embodiments according to the inventive concept, the first power and the second power are different voltage levels. In some embodiments according to the inventive concept, the first power and the second power are equal voltage levels.

In some embodiments according to the inventive concept, a data storage device can include at least one non-volatile memory that is included in a main storage unit. A storage device controller that can control operations of the at least one non-volatile memory. An auxiliary power supply can be configured to provide auxiliary power to the at least one non-volatile memory and the storage device controller at a sudden power off. The auxiliary power supply can be configured to begin charging operations after an inrush current is generated at a power-on or hot plug operation.

In some embodiments according to the inventive concept, the charging operation of the auxiliary power can start after supplying power to the at least one non-volatile memory and to the storage device controller ends. In some embodiments according to the inventive concept, power provided to the at least one non-volatile memory and the storage device controller and power to charge the auxiliary power supply are supplied from an external device.

In some embodiments according to the inventive concept, the device can further include a power supply that can be configured to supply the power provided to the at least one non-volatile memory and the storage device controller and the power to charge the auxiliary power supply.

In some embodiments according to the inventive concept, a method of operating a data storage device can be provided by receiving first power and second power at a data storage device, that includes a semiconductor memory, upon powering on of the data storage device or hot-plugging of the data storage device. The first power can be applied to the data storage device and the second power can be applied after a delay to an auxiliary power supply included in the data storage device based on when an inrush current, generated from applying the first power, occurred.

In some embodiments according to the inventive concept, applying the second power to the auxiliary power supply can be delayed for a predetermined time based on when the inrush current occurs to allow charging of the auxiliary power supply to begin after when inrush current occurs.

In some embodiments according to the inventive concept, applying the second power to the auxiliary power supply can be delayed responsive to detecting occurrence of the inrush current. In some embodiments according to the inventive concept, the second power can be applied to the auxiliary power supply after a delay responsive to detecting that occurrence of the inrush current has past. In some embodiments according to the inventive concept, the method can further include allowing charging of the auxiliary power supply to begin after when inrush current occurs.

BRIEF DESCRIPTION OF THE DRAWINGS

FIG. 8 is a diagram showing inrush current generated upon driving of a data storage device.

DETAILED DESCRIPTION OF EMBODIMENTS ACCORDING TO THE INVENTIVE CONCEPT

Figure 1:
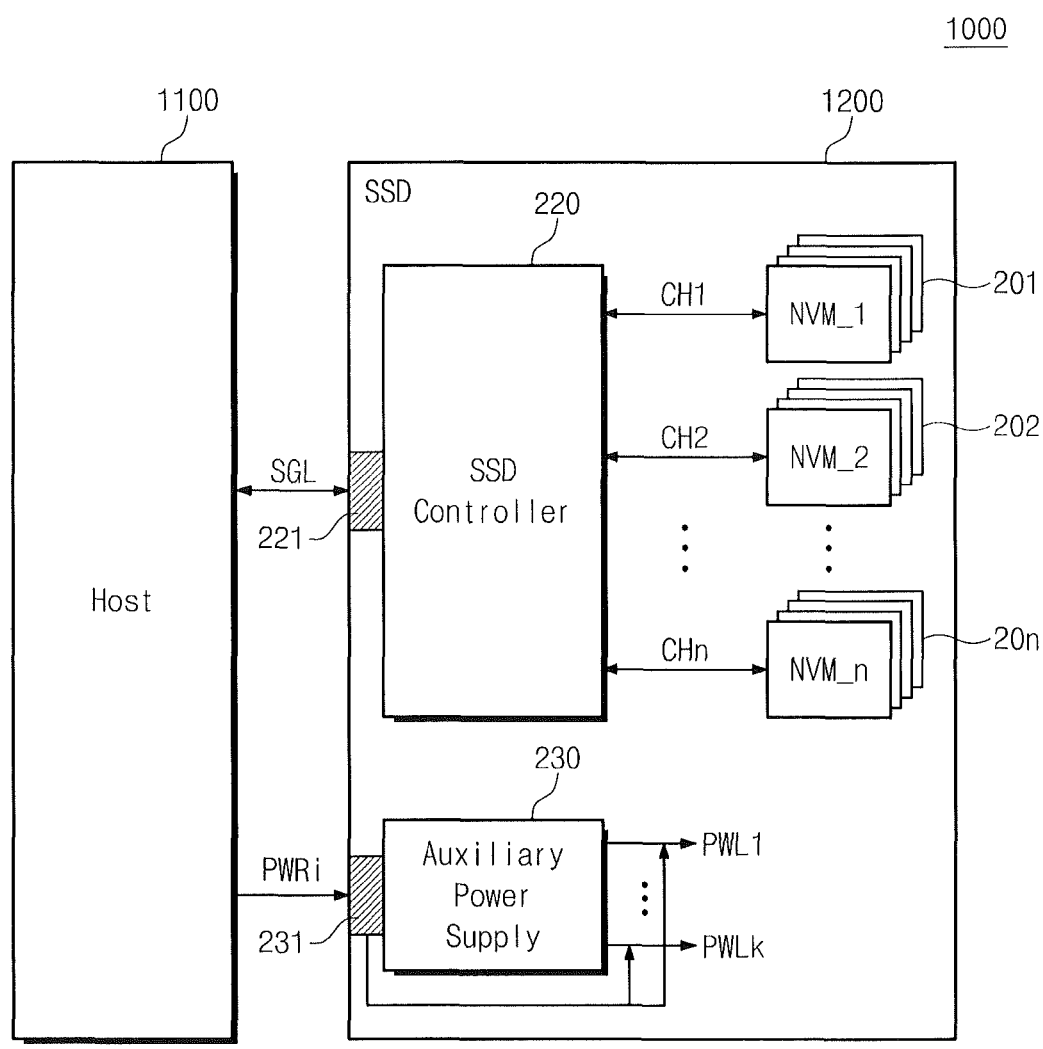
FIG. 1 is a block diagram showing a data storage device according to an exemplary embodiment of the inventive concept and a user device including the data storage device.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The inventive concept, for example, will be described using as a storage device a solid state drive (SSD) which adopts flash memories of semiconductor memories as main storage. But, a storage device and a data storing method according to an exemplary embodiment of the inventive concept may be applied to not only the SSD but also other types of storage devices (for example, a memory card, etc.).

In some embodiments according to the inventive concept, a first power PWR1 is the only power applied to a data storage device when an inrush current occurs, such as soon after power on or after hot-plugging the data storage device. A second power PWR2 (of for example 12V) is not provided to a power storing circuit until after the inrush current has already occurred (i.e. after the inrush current has past) so that current associated with the charging of a super capacitor (used as auxiliary power) does not occur simultaneously with the inrush current. This means that higher power consumption of the data storage device may be prevented when inrush current is generated. As a result, it may be possible to prevent an unexpected system-down and to provide a secure and stable operation of the data storage device.

FIG. 1 is a block diagram showing a data storage device according to an exemplary embodiment of the inventive concept and a user device including the data storage device.

Referring to FIG. 1, a user device 1000 according to an exemplary embodiment of the inventive concept includes a host 1100 and a data storage device 1200. The data storage device 1200 includes a storage device controller 220, one or more non-volatile memories 201 to 20$n$ ($n$ being 2 or more), and an auxiliary power supply 230.

Below, embodiments according to the inventive concept are described where a data storage device 1200 is a solid state disk or driver (SSD). But, the data storage device 1200 is not limited to an SSD. For example, the data storage device 1200 may be integrated in one semiconductor device in as a personal computer memory card international association (PC-MCIA) card, a CF, an SM, an SMC, a memory stick, an MMC, an RS-MMC, an MMC-micro, an SD card (SD, miniSD, microSD, SDHC), a UFS, or the like.

The host 1100 may be configured to control the data storage device 1200. The host 1100 may include portable electronic devices such as personal/portable computer, PDA, PMP, MP3 player, and the like, for example. The host 1100 and the data storage device 1200 may be interconnected by the standardized interface such as USB, SCSI, ESDI, SATA, SAS, PCI-express, or IDE interface. But, the manner for interconnecting the host 1100 and the data storage device 1200 may be implemented variously without limitation to this disclosure.

As illustrated in FIG. 1, where the data storage device 1200 forms the SSD, the storage device controller 220 may form an SSD controller.

The data storage device 1200 sends and receives signals to and from the host 1100 via a signal connector 221 and receives power via a power connector 231.

The non-volatile memories 201 to 20$n$ in the data storage device 1200 may be used as main storage or storage media of the data storage device 1200. The storage device controller 220 controls read, write, and erase operations of the nonvolatile memories 201 to 20n in response to a request from the host 1100. The non-volatile memories 201 to 20n may be a non-volatile memory device NVM having the mass storage capacity. In this case, the data storage device 1200 may retain data stored therein even after power is removed.

Among non-volatile memories, a flash memory may be used to implement the non-volatile memories 201 to 20n. Further, PRAM, MRAM, ReRAM, FRAM, etc. can be used to implement the non-volatile memories 201 to 20n. In some embodiments, volatile memories such as DRAM or SRAM or a hybrid memory formed of two types of memories can be used to implement the non-volatile memories 201 to 20n.

Flash memory chips forming the non-volatile memories 201 to 20n may be formed of NAND flash memory cells or NOR flash memory cells. Alternatively, flash memory chips forming the non-volatile memories 201 to 20n may be formed of NAND and NOR flash memory cells. A group of memory cells is called a memory cell array. The memory cell array in each of the non-volatile memories 201 to 20n may be formed of a plurality of blocks, each of which has a plurality of pages. Each page includes a plurality of memory cells sharing one word line. Memory cells in one word line are used to store one or more pages. In other words, each memory cell may store 1-bit data or M-bit data (M being 2 or more integer).

A charge storage layer of a memory cell may be formed in various types. For example, a charge storage layer of a memory cell is formed of polysilicon or an insulation film such as Si3N4, Al2O3, HfAlO, HfSiO, etc. A flash memory using an insulation film such as Si3N4, Al2O3, HfAlO, HfSiO, etc. as a charge storage layer is called a charge trap flash (CTF) memory.

The non-volatile memories 201 to 20n may be connected with the storage device controller 220 via a plurality of channels CH1 to CHn. One channel is connected with one or more memory devices, which are connected with the same data bus.

The storage device controller 220 sends and receives a signal SGL with the host 1100 via the signal connector 221. Here, the signal SGL may include commands, addresses, and data. The storage device controller 220 may write or read data in or from a memory device according to a command of the host 1100.

The data storage device 1200 is provided with power PWRi used for operations from an internal or external power supply. A power PWRi supplied to the data storage device 1200 from an external device may be provided to internal elements of the data storage device 1200 via a plurality of power lines PWL1 to PWLk. Internal elements of the data storage device 1200 may be classified into a plurality of power domains. But, the power can be suddenly interrupted due to user carelessness or device defects. This is sometimes referred to herein as a "sudden power off."

The data storage device 1200 may cease to operate upon the sudden power off. Further, the data storage device 1200 may suffer damage due to the sudden power off. For example, data to be read or written from or in the data storage device 1200 may be lost.

In order to cope with the sudden power off, the data storage device 1200 includes the auxiliary power supply 230. The auxiliary power supply 230 is placed inside or outside the data storage device 1200. For example, the auxiliary power supply 230 is placed on a main board to supply an auxiliary power to the data storage device 1200. The auxiliary power supply 230 may include a power storing circuit capable of storing an auxiliary power. Condensers or capacitors of charging and discharging charges can be used as the power storing circuit. Below, there will be described an example that capacitors (sometimes referred to herein as a "super capacitor") (refer to 235 in FIG. 4) are used as the power storing circuit capable of storing charge. The auxiliary power supply 230 may be connected with the host 1100 via the power connector 231. The auxiliary power supply 230 charges the power storing circuit such as the super capacitor using the power PWRi from the host 1100.

The auxiliary power supply 230 may be used as auxiliary power for the data storage device 1200 to perform operations to prevent data or calculation loss after the sudden power off. A voltage from the auxiliary power supply 230 may be applied to internal elements of the data storage device 1200 via the plurality of power lines PWL1 to PWLk.

To reduce the inrush of current (inrush current) at power-on or a hot-plug operation, the data storage device 1200 may delay charging of the power storing circuit by delaying when power (for example, PWR2 in FIG. 4) is applied to the power storing circuit (for example, a super capacitor) in the auxiliary power device 230, or timing when the power storing circuit is allowed to charge.

In some embodiments according to the inventive concept, the power storing circuit of the auxiliary power supply 230 may be allowed to charge after the inrush current has already occurred upon power-on or a hot plug operation. That is, since charging of a power storing circuit (which can cause large power consumption) is allowed after the inrush current has occurred, power consumption of the data storage device 1200 may be reduced at power-on of a hot plug operation of the data storage device 1200. Accordingly, it may be possible to prevent an unexpected system-down phenomenon and to provide for secure and stable operation of the data storage device 1200.

Figure 2:
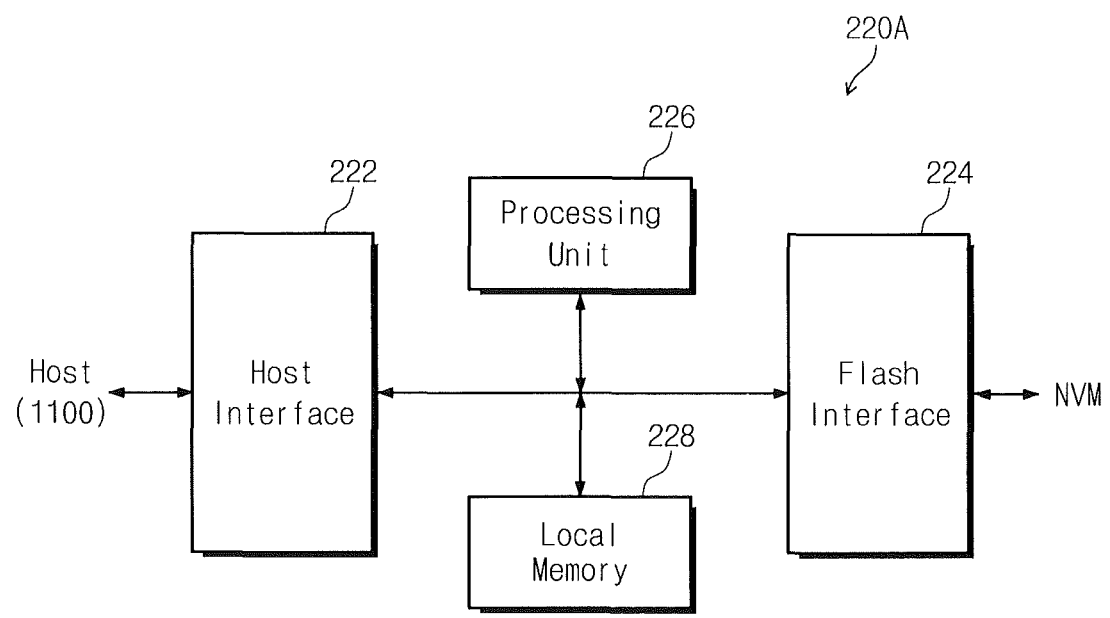
FIG. 2 is a block diagram showing a storage device controller illustrated in FIG. 1 according to an exemplary embodiment of the inventive concept.

FIG. 2 is a diagram showing a storage device controller illustrated in FIG. 1 according to an exemplary embodiment of the inventive concept.

Referring to FIG. 2, a storage device controller 220A includes a host interface 222, a flash interface 224, a processing unit 226, and a local memory 228. The storage device controller 220A may further comprise an ECC circuit for performing detecting and correcting errors of data stored in non-volatile memories 201 to 20n, other circuits may also be included.

The host interface 222 provides an interface with a host 1100, and the flash interface 224 provides an interface with the non-volatile memories 201 to 20n. The processing unit 226 controls an overall operation of the storage device controller 220A. In an exemplary embodiment, the processing unit 226 may be a commercial or custom microprocessor.

The local memory 228 may be one or more general-purpose memories which store software for operating the data storage device 1200 or data. The local memory 228 may include cache, ROM, PROM, EPROM, EEPROM, PRAM, flash memory, SRAM, and DRAM. The local memory 228 is used to store data to be written or read in or from the non-volatile memories 201 to 20n.

Figure 3:
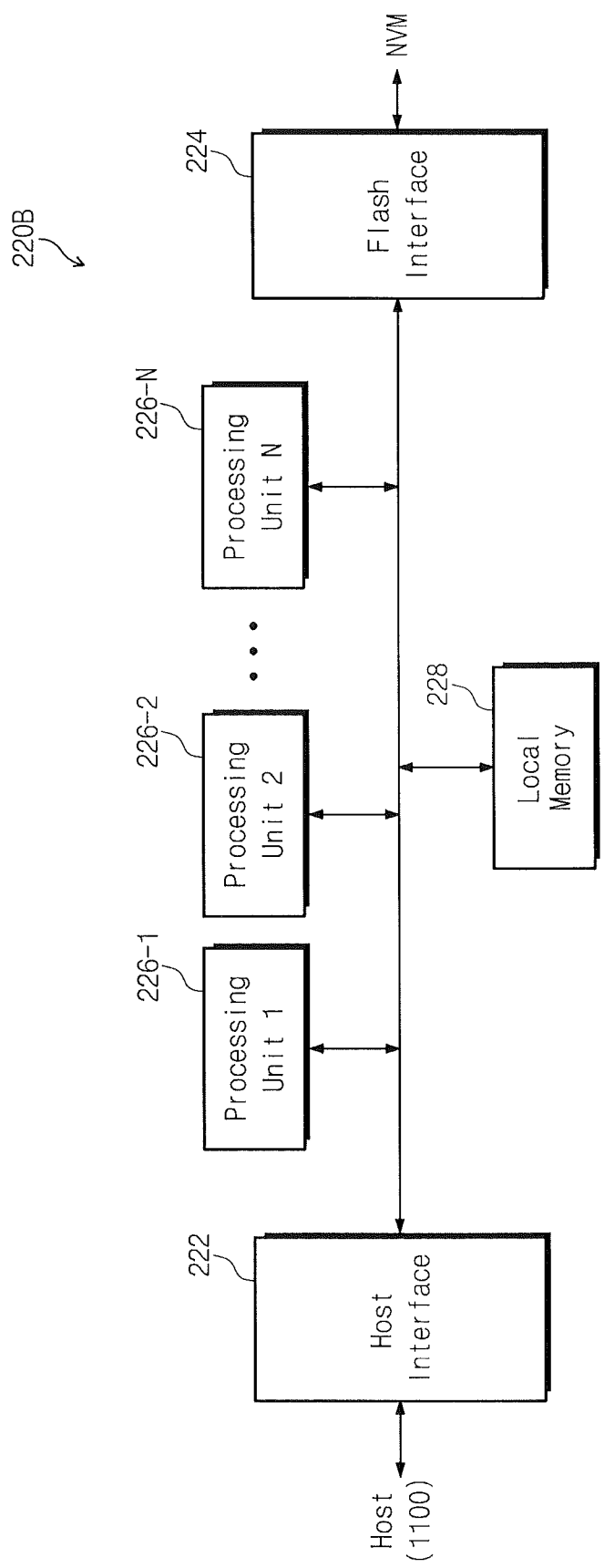
FIG. 3 is a block diagram showing a storage device controller illustrated in FIG. 1 according to another exemplary embodiment of the inventive concept.

FIG. 3 is a diagram showing a storage device controller illustrated in FIG. 1 according to another exemplary embodiment of the inventive concept.

In FIG. 3, there is illustrated an example that a storage device controller 220B includes a plurality of processing units 226-1 to 226-N. The architecture that a storage device controller 220B includes a plurality of processing units 226-1 to 226-N is called a multi-core processor. On the other hand, as illustrated in FIG. 2, the architecture that a storage device controller 220A includes one processing unit 226 is called a single-core processor.

The storage device controller 220B performs an overall operation via the plurality of processing units 226-1 to 226-N.

The storage device controller 220B divides a plurality of control operations into groups and assigns groups to the plurality of processing units 226-1 to 226-N. With the above configuration, plural control operations may be performed in parallel. In an exemplary embodiment, the plurality of processing units 226-1 to 226-N may correspond to a plurality of channels CH1 to CHn, respectively. Thus, the channels CH1 to CHn may be controlled independently. With this architecture, although the storage device controller 220B is driven by a low frequency clock, the performance of the storage device controller 220B may be improved via independent control on the plurality of channels CH1 to CHn.

Figure 4:
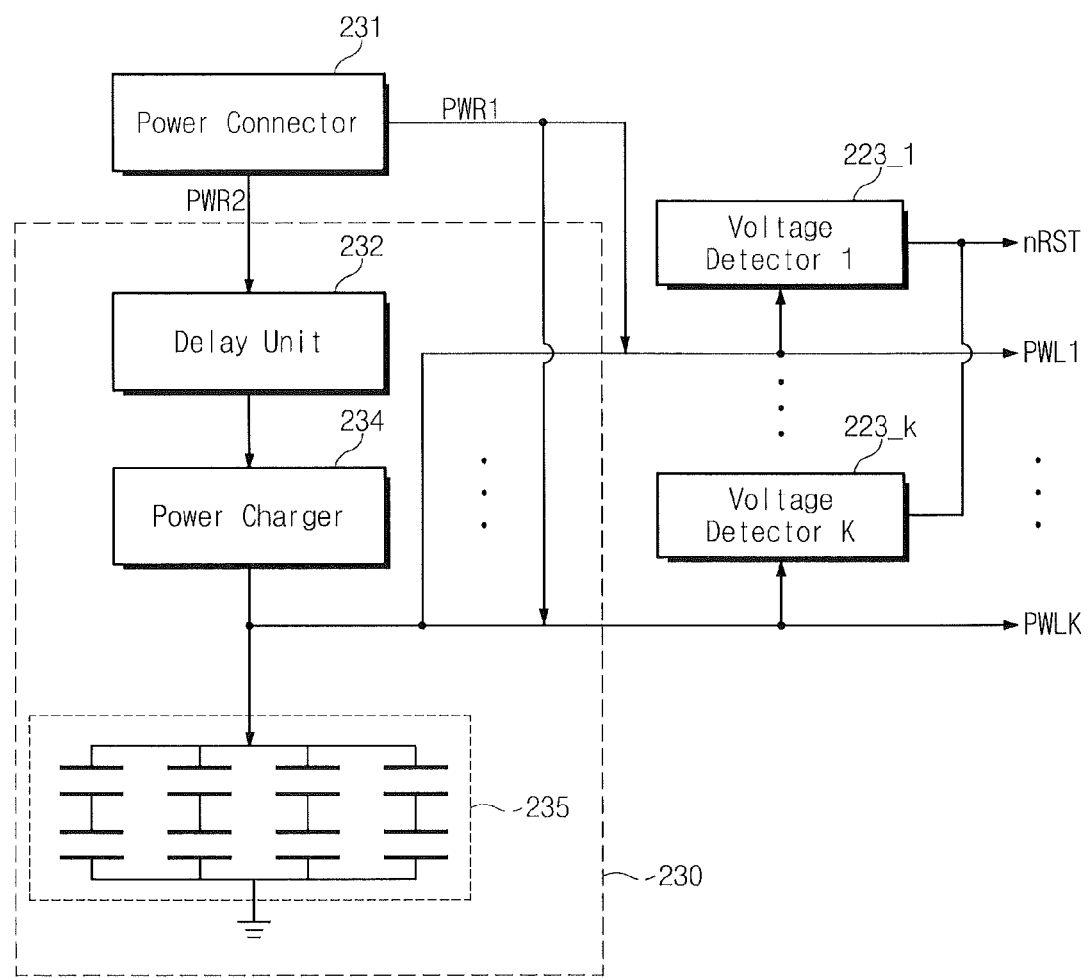
FIG. 4 is a block diagram showing an auxiliary power supply according to an exemplary embodiment of the inventive concept.
Figure 5:
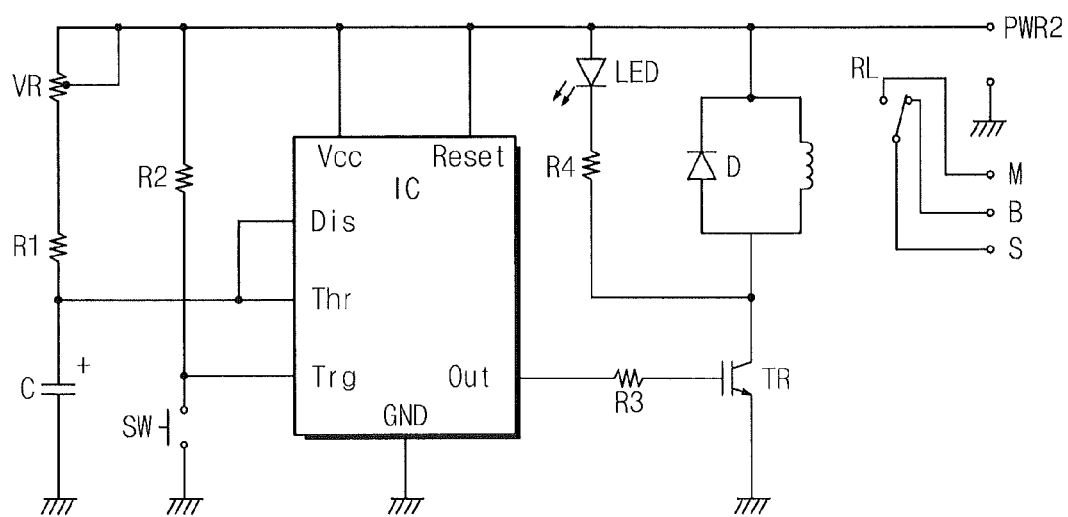
FIG. 5 is a block diagram showing a delay unit illustrated in FIG. 4.

FIG. 4 is a diagram showing an auxiliary power device according to an exemplary embodiment of the inventive concept, and FIG. 5 is a diagram showing a delay unit illustrated in FIG. 4.

Referring to FIG. 4, a data storage device 1200 is supplied with a power PWRi from an external device (for example, a host 1100) via a power connector 231. A power source supplying a power PWRi to the data storage device 1200 may include a DC power source, an AC power source, a rechargeable battery, and the like.

The power PWRi provided from an external device via the power connector 231 may have one or more levels. For example, in case of a user device 1000 supporting an SATA interface, powers of 3.3V, 5V, and 12V are provided simultaneously to the data storage device 1200 via the power connector 231 from an external device. For this, P1 to P3 pins of the SATA connector may be assigned to a power of 3.3V, P7 to P9 pins may be assigned to a power of 5V, and P13 to P15 pins may be assigned to a power of 12V.

At least some or all of the power provided to the data storage device 1200 may be used thereby according to design manners and uses of the data storage device 1200. For example, where the data storage device 1200 is a mass storage device within a server, it may use powers of 5V and 12V. That is, a power of 3.3V is not used.

In FIG. 4, there is illustrated an example that a first power PWR1 and a second power PWR2 are provided from an external device via the power connector 231. It is assumed that the first power PWR1 is 5V and the second power PWR2 is 12V. The number of and types of power supplied via the power connector 231 is not limited by this disclosure. For example, the first and second powers PWR1 and PWR2 may have the same level or different levels from each other. Further, other powers can be provided to the data storage device 1200 with the first and second powers PWR1 and PWR2.

As illustrated in FIG. 4, the first power PWR1 provided via the power connector 231 may be provided to internal elements of the data storage device 1200 via a plurality of power lines PWL1 to PWLk. For example, the first power PWR1 of 5V may be provided to a storage device controller 220, the plurality of non-volatile memories 201 to 20n, a voltage regulator, voltage detectors 223_1 to 223_k (k being 2 or more), a buffer memory, and the like. Internal elements of the data storage device 1200 such as the storage device controller 220, the plurality of non-volatile memories 201 to 20n, the voltage regulators 223_1 to 223_k, and the buffer memory may be divided into a plurality of power domains. In an exemplary embodiment, the first power PWR1 is used as power for operating the data storage device 1200 from a time when the data storage device 1200 is powered on to a time when it is normally powered off. The data storage device 1200 can further include one or more voltage regulators to stabilize a power provided to internal elements of the data storage device 1200.

Second power PWR2 provided via the power connector 231 is provided to an auxiliary power supply 230 to charge a power storing circuit provided within the auxiliary power supply 230. In an exemplary embodiment, upon a sudden power off of the data storage device 1200, an auxiliary power stored by the power storing circuit may be supplied to internal elements of the data storage device 1200 via the plurality of power lines PWL1 to PWLk. As a result, although the supply of power from an external device may be suddenly interrupted, data and calculation loss may be prevented via the use of auxiliary power.

The auxiliary power supply 230 includes a delay unit 232, a power charger 234, and a charge cell array 235.

The charge cell array 235 may include at least one charge cell. The charge cell indicates a power storing circuit such as a super capacitor. The super capacitor can store substantial charge. In FIG. 4, there is exemplarily illustrated an example that four pairs of two serially-connected charge capacitors are connected in parallel. The configuration of the charge cell array 235 is not limited by this disclosure.

The delay unit 232 is connected between the power connector 231 and the power charger 234 and delays when the second power PWR2 provided from the power connector 231 is applied to the power charger 234, by a predetermined time. In an exemplary embodiment, the delay unit 232 delays when the second power PWR2 is applied to the power charger 234, by one second. The delay in applying the second power PWR2 using the delay unit 232 may correspond to a time (for example, 620 ms) after inrush current is generated from the data storage device 1200 at power-up or a hot plug operation. The delay in applying the second power PWR2 using the delay unit 232 is not limited to a specific example (for example, one second). It is possible to determine such timing at any time after inrush current is generated. For example, in some embodiments, the delay can be specified to be any time that allows charging after the inrush current is detected.

In FIG. 5, there is exemplarily illustrated a delay unit 232 based on the 555 timer circuit. Apply timing of a second power PWR2 (that is, a delay time of the delay unit 232) may be determined by adjusting values of resistors R1 and R2 and a capacitor C of the delay unit 232. The configuration of the delay unit 232 is not limited by this disclosure.

Returning to FIG. 4, a power charger 234 can charge the charge cell array 235 using the second power PWR2 from a power connector 231. During charge operations, the power charger 234 may supply charges to the charge cell array 235. In an exemplary embodiment, the power charger 234 may include an internal power supply device (not shown). In this case, the power charger 234 can charge the charge cell array 235 using the internal power supply device.

The power charger 234 may include an output stage having a unidirectional element. Here, the unidirectional element may be used to prevent current or a voltage from the power charger 234 from flowing in reverse. In an exemplary embodiment, the unidirectional element may be a diode.

An auxiliary power charged by the charge cell array 235 may be supplied to internal elements of the data storage device 1200 via a plurality of power lines PWL1 to PWLk at sudden power off. A plurality of power boosters can be connected between the charge cell array 235 and the plurality of power lines PWL1 to PWLk. In an exemplary embodiment, each power booster boosts auxiliary power provided from the charge cell array 235 to supply a boosted voltage to a corresponding power line. Each booster may include a unidirectional element provided at its output stage.

The power lines PWL1 to PWLk may be connected with voltage detectors 223_1 to 223_k which sense (or, detect)

voltage levels of the power lines PWL1 to PWLk, respectively. In some embodiments according to the inventive concept, each of the voltage detectors 223_1 to 223_k may be implemented by a CMOS transistor. In another exemplary embodiment, each of the voltage detectors 223_1 to 223_k may be implemented as an open drain transistor.

Voltages detected by the voltage detectors 223_1 to 223_k are connected in a wired-OR manner to generate a reset signal nRST. With this configuration, if at least one of the voltage detectors 223_1 to 223_k detects a voltage below a predetermined voltage, the reset signal nRST may be produced. The reset signal nRST generated by the voltage detectors 223_1 to 223_k indicates a power off reset signal. In some embodiments according to the inventive concept, the reset signal nRST is generated before sudden power off occurs, so that data and calculation loss in the data storage device 1200 may be avoided.

Figure 6:
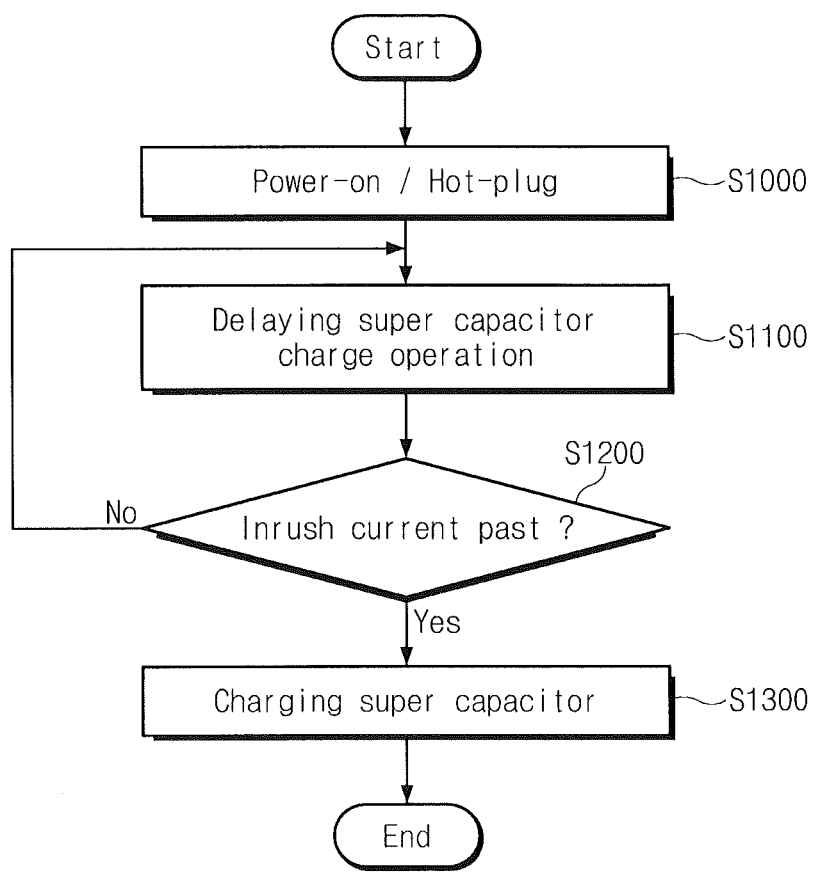
FIG. 6 is a flowchart describing driving methods of a data storage device according to an exemplary embodiment of the inventive concept.

FIG. 6 is a flowchart for describing a driving method of a data storage device according to an exemplary embodiment of the inventive concept.

Referring to FIG. 6, a driving method of a data storage device 1200 according to an exemplary embodiment may include performing a power-on operation or a hot-plug operation (S1000). The hot-plug operation includes adding or replacing a new data storage device without stopping a service of a server or a computer. In this case, the server or computer may recognize the added or replaced data storage device without delay.

The data storage device 1200 is supplied with a first power PWR1 and a second power PWR2 from an external device (for example, a host 1100) and supplies the first power PWR1 to internal elements of the data storage device 1200. At this time, a charge operation on a power storing circuit (for example, a super capacitor) of an auxiliary power supply 230 may be delayed (S1100).

There is checked whether inrush current is generated at the data storage device 1200. For example, if no inrush current is generated, the method proceeds to operation S1100, so that the charge operation on the power storing circuit (for example, a supper capacitor) is delayed until the inrush current is generated. After the inrush current has past, a power charger 234 charges the power storing circuit (for example, a super capacitor) using the second power PWR2 from the external device (for example, the host 1100) (S1300).

In an exemplary embodiment, the first power PWR1 and the second power PWR2 may have the same voltage level (for example, 5V). Alternatively, the first power PWR1 and the second power PWR2 may have different voltage levels. Here, voltage levels of the first and second powers PWR1 and PWR2 are not limited to a predetermined value.

The start time of the charging operation of the auxiliary power may be varied. For example, a charging operation of the auxiliary power can be delayed until after a time when power supplied to internal elements of the data storage device 1200 ends. Since the auxiliary power is used to perform a data backup function at a sudden power off, it is not used at an initial driving operation in which no backup data exists.

Figure 7:
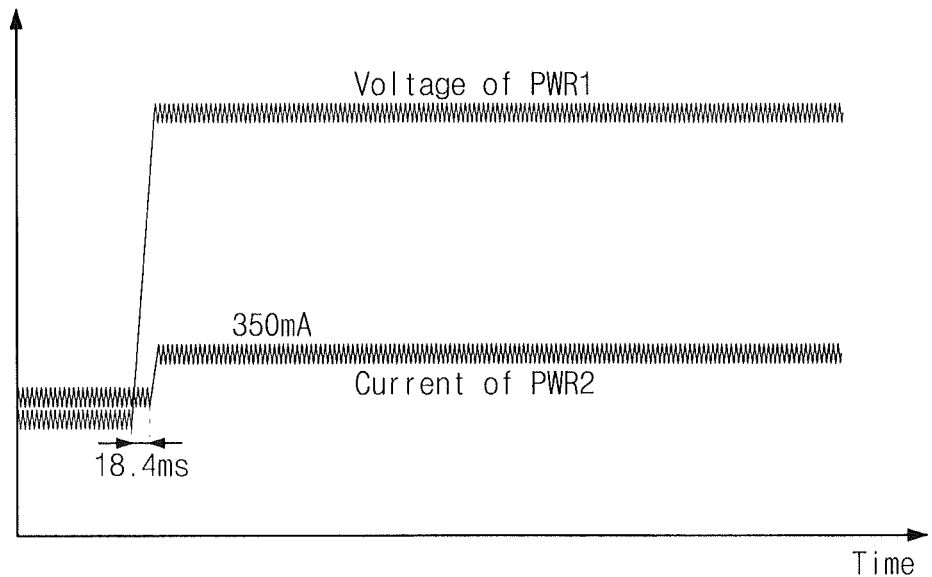
FIG. 7 is a diagram showing a variation of current generated upon driving of a conventional data storage device.

FIG. 7 is a diagram showing a variation of current generated upon driving of a data storage device where an inrush current reducing method according to an exemplary embodiment of the inventive concept is not applied.

Where a data storage device 1200 is supplied with a first power PWR1 of 5V and a second power PWR2 of 12V from an external device via a power connector 231, the first power PWR1 of 5V and the second power PWR2 of 12V may be simultaneously applied to the data storage device 1200 according to the SATA interface specification. In this case, the first power PWR1 of 5V may be applied to internal elements of the data storage device 1200. The second power PWR2 of 12V may be used to charge a super capacitor of an auxiliary power supply 230.

Referring to FIG. 7, in the event that an inrush current reducing scheme according to an exemplary embodiment of the inventive concept is not utilized (or, where no auxiliary power supply 230 has a delay unit), charging of the super capacitor may begin at a time when the first and second powers PWR1 and PWR2 is applied. As illustrated in FIG. 7, the super capacitor begins charging after the data storage device 1200 is powered on or after a data storage device is replaced with a new data storage device (or, a hot plug operation is executed) and a time of about 18.4 ms lapses. At this time, a data storage device consumes current of about 350 mA associated with charging of the super capacitor at the second power PWR2 of 12V, and a transient power of 4.2 W is consumed.

In FIG. 7, only current flowing to a data storage device on the second power PWR2 of 12V is illustrated. That is, no current flowing to a data storage device on the first power PWR1 of 5V is illustrated in FIG. 7. On the other hand, current flowing to a data storage device on the first power PWR1 of 5V is illustrated, while current flowing to a data storage device on the second power PWR2 of 12V is not illustrated in FIG. 8.

Here, a point of time of charging a super capacitor and a value of current flowing to a data storage device are exemplarily illustrated according to the simulation result. Accordingly, a point of time of charging a super capacitor and a value of current flowing to a data storage device are not limited by this disclosure.

Figure 9:
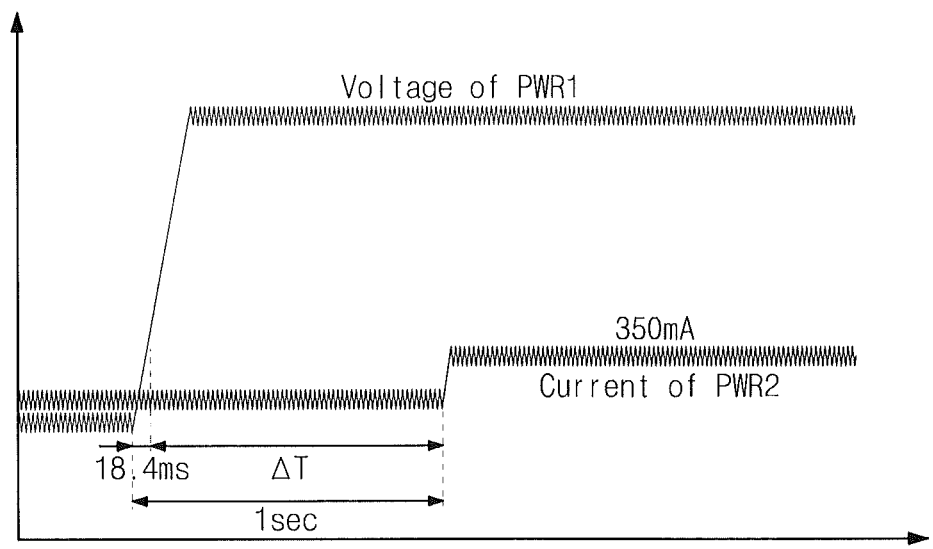
FIG. 9 is a diagram showing a variation of current generated upon driving of a data storage device where an inrush current reducing method in some embodiments according to the inventive concept.

FIG. 8 is a diagram showing inrush current generated upon driving of a data storage device, and FIG. 9 is a diagram showing a variation of current generated upon driving of a data storage device where an inrush current reducing method according to an exemplary embodiment of the inventive concept is applied.

Referring to FIG. 8, inrush current can be generated after a data storage device is powered on or replaced and a time of about 620 ms elapses. For example, as illustrated in FIG. 7, while current of about 350 mA continues to flow with respect to a second power PWR2 of 12V, inrush current of 2.12 A can be further generated with respect to a first power PWR1 of 5V as illustrated in FIG. 8. At this time, transient current flowing via the first and second power PWR1 and PWR2 may be given by the expression of 2.47 A (2.12 A+0.35 A), and a transient power of 14.8 W (2.12 A*5V+0.35 A*12V) may be consumed. That is, upon generation of the of the inrush current, the amount of current flowing to a data storage device and a transient power consumed may be increased by about three to four times compared to the situation where no inrush current is generated. This means that the amount of a power consumed by a data storage device upon generating of the inrush current may increase sharply.

A sharp increase in power consumption due to inrush current may subject constituent elements of a data storage device to damage, the usable power supply voltage of other circuits to be lowered, and cause a system error. In particular, where a plurality of data storage devices is connected with a user device 1000, a transient power consumed at generating of inrush current may increase more sharply. Therefore, there is increased the probability that a system error is caused due to inrush current as the number of data storage devices connected with the user device 1000 is increased.

In order to address the above, as understood from FIG. 9, a data storage device 1200 according to some embodiments of the inventive concept may be configured to delay the time when a power storing circuit (for example, a super capacitor) of an auxiliary power supply 230 is allowed to charge after a power-on operation or a hot plug operation, such as about one second after power on. In an exemplary embodiment, delaying charging of the power storing circuit may be accomplished by a voltage delay operation of a delay unit 232 which is connected between a power connector 231 and a power charger 234.

The delay unit 232 delays a point of time when the second power PWR2 is applied to the power storing circuit via the power charger 234, by a predetermined time (for example, one second), such that the power storing circuit (for example, a super capacitor) is charged after the inrush current is generated (and has past) from the data storage device 1200 at a power-on operation or a hot plug operation. For example, the power storing circuit (for example, a super capacitor) is charged after a power-on operation or a hot plug operation is executed and a time (for example, 620 ms) lapses. Here, an applying point of time of the second power PWR2 delayed by the delay unit 232 is not limited to this disclosure, and it can be changed variously at any time after the inrush current is generated.

In some embodiments according to the inventive concept, a first power PWR1 is the only power applied to a data storage device when an inrush current occurs, such as soon after power on or after hot-plugging the data storage device. A second power PWR2 (of for example 12V) is not provided to a power storing circuit until after the inrush current has already occurred (i.e. after the inrush current has past) so that current associated with the charging of a super capacitor (used as auxiliary power) does not occur simultaneously with the inrush current. This means that higher power consumption of the data storage device may be prevented when inrush current is generated. As a result, it may be possible to prevent an unexpected system-down and to provide a secure and stable operation of the data storage device.

With the above-described inrush current reducing scheme, it is possible to reduce a consumed power of the data storage device 1200 by 30% by only delaying a point of time when the second power PWR2 is applied. Accordingly, inrush current can be reduced effectively with a low cost.

An inrush current reducing effect according to the inventive concept may be increased when a data storage device 1200 is used as a mass storage device of a server or when the number of data storage devices connected with a system is increased. A data storage system including a plurality of data storage devices will be described with reference to FIGS. 12 and 13.

Figure 10:
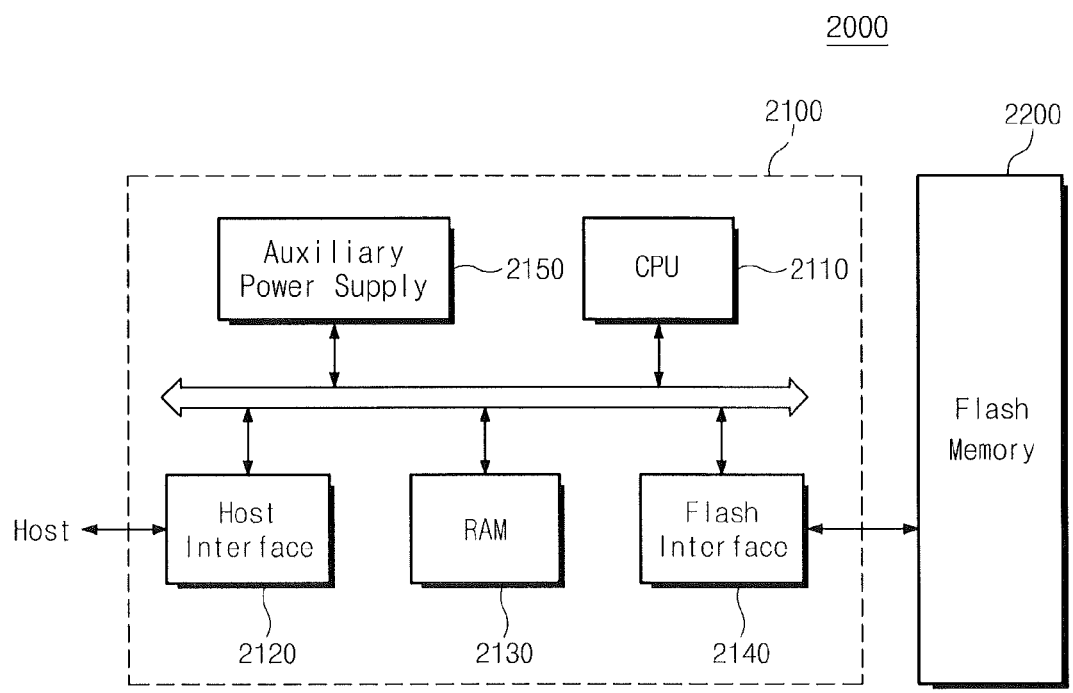
FIG. 10 is a block diagram showing a data storage device according to another exemplary embodiment of the inventive concept.

FIG. 10 is a block diagram showing a data storage device according to another exemplary embodiment of the inventive concept.

Referring to FIG. 10, a data storage device 2000 according to another exemplary embodiment of the inventive concept includes a flash memory 2200 and a memory controller 2100.

The flash memory 2200 illustrated in FIG. 10 is substantially identical to that illustrated in FIG. 1, and description thereof is thus omitted. The flash memory 2200 may be configured to have any one of a source-drain free flash structure, a pin-type flash structure, a three-dimensional flash structure, and a stack flash structure where arrays are stacked in multi layers.

The memory controller 2100 is configured to control the flash memory 2200. The memory controller 2100 is substantially identical to a storage device controller illustrated in FIG. 1.

RAM 2130 may be used as a work memory of CPU 2110. A host interface 2120 may have the data exchange protocol of a host connected with the data storage device 2000. A flash interface 2140 may interface with the flash memory 2200 according to an exemplary embodiment of the inventive concept. The CPU 2110 may control an overall operation for data exchange of the memory controller 2100. The data storage device 2000 may further include ROM for storing code data for interfacing with the host, an ECC block for detecting and correcting errors in data read from the flash memory 2200, and the like.

An auxiliary power supply 2150 may include a power storing circuit which is capable of storing auxiliary power. The power storing circuit may be condensers or capacitors capable of charging and discharging. The auxiliary power supply 2150 can charge the power storing circuit using power provided from a host. The power storing circuit may be used as auxiliary power of the data storage device 2000 to prevent data and calculation loss, at sudden power off.

The data storage device 2000 may be configured to charge the power storing circuit (for example, a super capacitor) of the auxiliary power supply 2150 after generating the inrush current, so that the influence of the inrush current is reduced at a power-on operation or a hot plug operation. Since the power storing circuit is allowed to charge after the inrush current occurs, it is possible to reduce power consumption of the data storage device 2000 at power-on or a hot plug operation. As a result, it is possible to prevent the unexpected system-down phenomenon and to secure a stable operation of the data storage device 2000.

The auxiliary power supply 2150 can be placed inside or outside the data storage device 2000. For example, the auxiliary power supply 2150 can be placed on a main board to supply auxiliary power to the data storage device 2000. The auxiliary power supply 2150 can be substantially identical to that illustrated, for example, in FIGS. 1 and 4.

In some embodiments, the data storage device 2000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, e-book, portable game machine, navigation system, black box, digital camera, digital multimedia broadcasting (DMB) player, 3-dimensional television, a device capable of transmitting and receiving information at a wireless circumstance, one of various electronic devices constituting home network, one of various electronic devices constituting computer network, one of various electronic devices constituting telematics network, RFID, or one (SSD or memory card) of various electronic devices constituting computing system.

Figure 11:
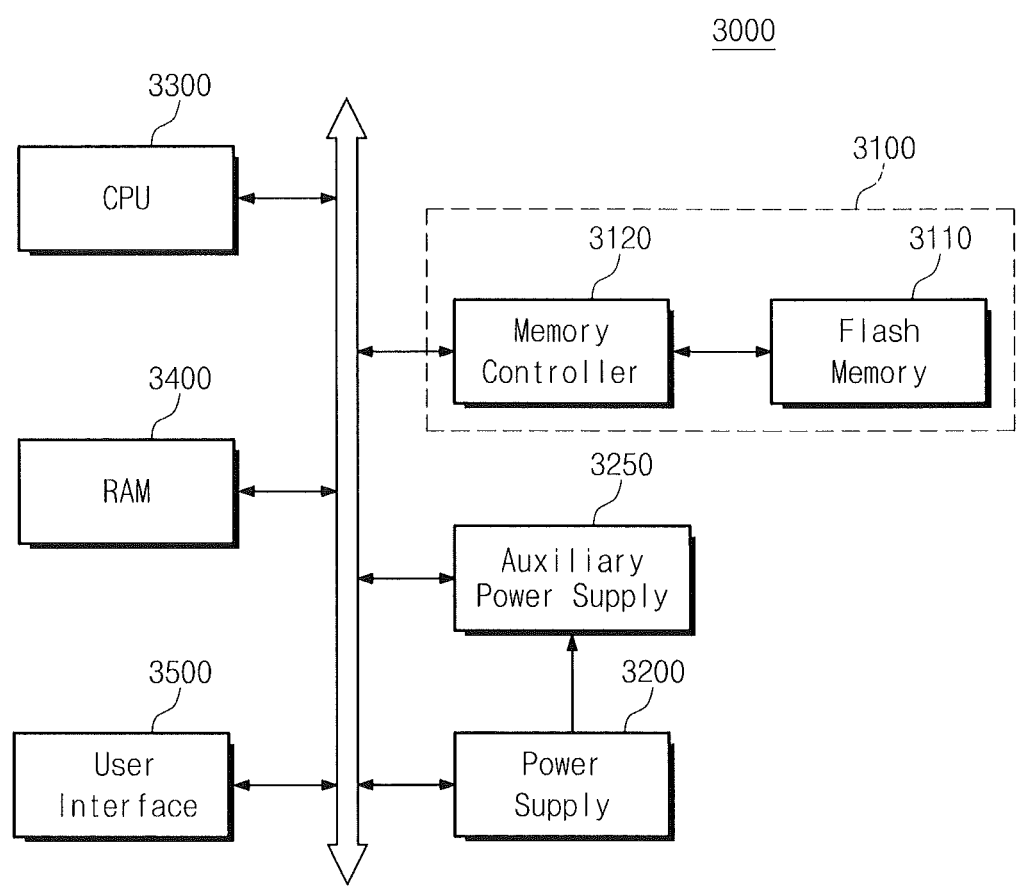
FIG. 11 is a block diagram showing a computing system according to an exemplary embodiment of the inventive concept.

FIG. 11 is a diagram showing a computing system according to an exemplary embodiment of the inventive concept.

Referring to FIG. 11, a computing system 3000 includes a memory controller 3120, a power supply 3200, an auxiliary power supply 3250, CPU 3300, RAM 3400, a user interface 3500, and a flash memory 3110 connected with the memory controller 3120. The flash memory device 3110 illustrated in FIG. 11 is substantially identical to that illustrated in FIG. 1, and description thereof is thus omitted.

Where the computing system is a mobile device, it may further comprise a battery which supplies an operating voltage of the computing system to the power supply 3200. Although illustrated in FIG. 11, the computing system may further comprise an application chipset, a camera image processor (CIS), a mobile DRAM, and the like. The memory controller 3120 and the flash memory device 3110 may constitute a solid state drive/disk (SSD) 3100 which uses non-volatile memories to store data.

The flash memory device 3110 and/or the memory controller 3120 may be included in various packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The auxiliary power supply 3250 can charge a power storing circuit (for example, a super capacitor) of the auxiliary power supply 3250 using a power from the power supply 3200. The power storing circuit of the auxiliary power supply 230 may be used to prevent data or calculation loss. The auxiliary power supply 3250 illustrated in FIG. 11 can be substantially identical to that illustrated in, for example, FIGS. 1 and 4.

The computing system 3000 may be configured to allow charging of the power storing circuit (for example, a super capacitor) of the auxiliary power supply 3250 after the inrush current has already occurred, so that the influence due to the inrush current may be reduced at power-on or hot plug operation. Since the power storing circuit begins charging after the inrush current is generated, it is possible to prevent the problem that a power is sharply consumed by the computing system 3000 at a power-on or hot plug operation. As a result, it is possible to prevent the unexpected system-down phenomenon and to secure a stable operation of the computing system 3000.

An inrush current reducing effect according to the inventive concept may be increased when a data storage device 1200 or 2000 is used as a mass storage device of a server or when the number of data storage devices connected with a system is increased. A data storage device including a plurality of data storage devices will be more fully described below.

Figure 12:
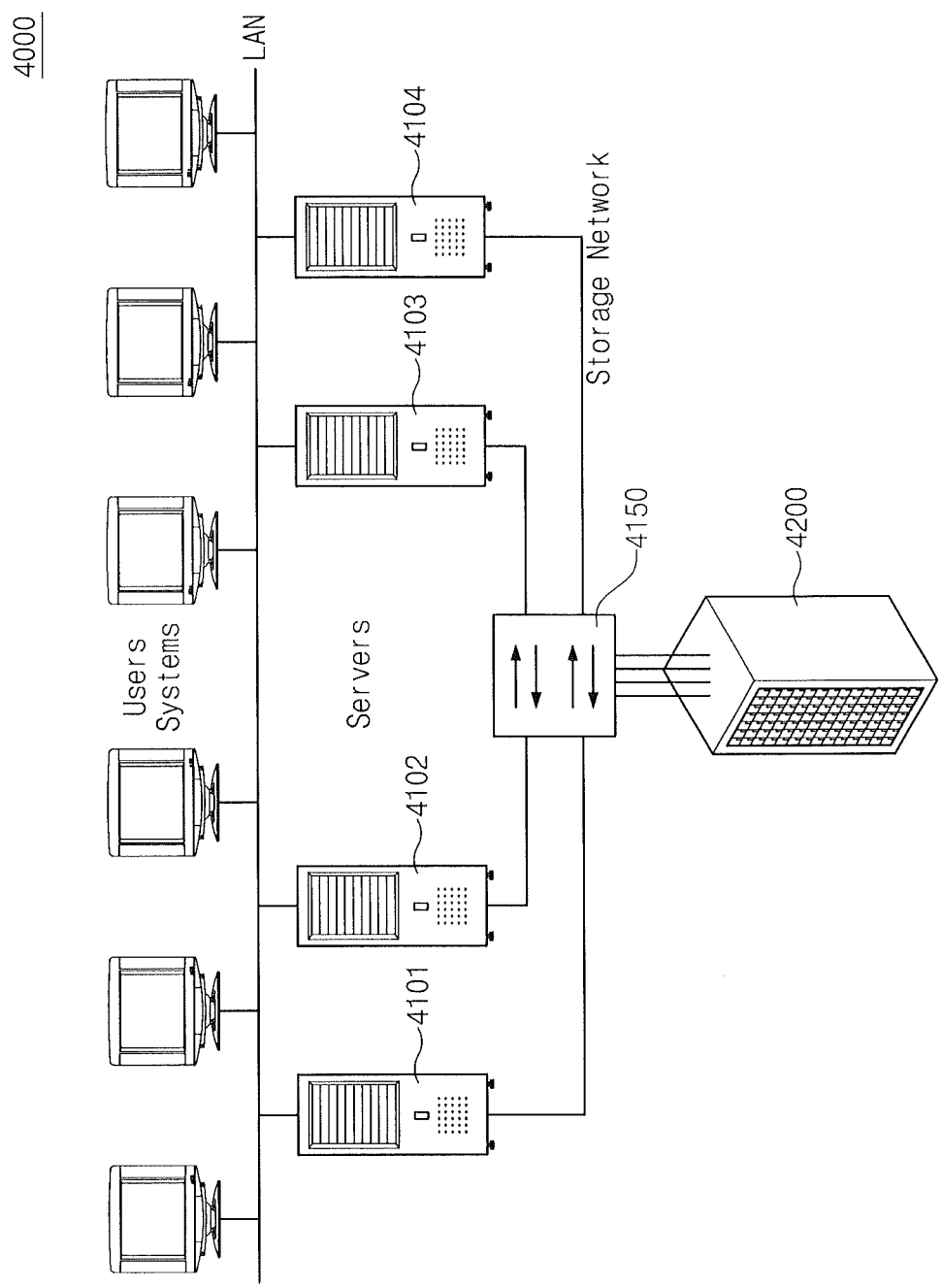
FIG. 12 is a block diagram showing a data processing system according to an exemplary embodiment of the inventive concept.

FIG. 12 is a diagram showing a data processing system according to an exemplary embodiment of the inventive concept. In FIG. 12, there is exemplarily illustrated an example of a data processing system 4000 which uses a data storage device 1200 according to an exemplary embodiment of the inventive concept as a mass storage device of a server.

Referring to FIG. 12, the data processing system 4000 may include a plurality of user systems connected with a local network such as LAN, a plurality of servers 4101 to 4104, an Ethernet switch 4150, and a mass storage device 4200.

The data processing system 4000 may form a network attached storage (NAS) and a storage area network (SAN). The data processing system 4000 may be configured to gather scattered data storage devices in one mass storage device 4200 and to manage it collectively. The plurality of servers 4101 to 4104 may be connected in common with the Ethernet switch 4150 via an Ethernet LAN card. A data storage space of the mass storage device 4200 is assigned to each of the servers 4101 to 4104 via the Ethernet switch 4150, and the assigned data storage spaces are used by user systems connected with the servers 4101 to 4104. The mass storage device 4200 supporting the above-described data storage manner is called a networked storage. The NAS can use the Ethernet by selecting a network as an intermediate medium, and the SAS can use the fiber channel by selecting a network as an intermediate medium.

Figure 13:
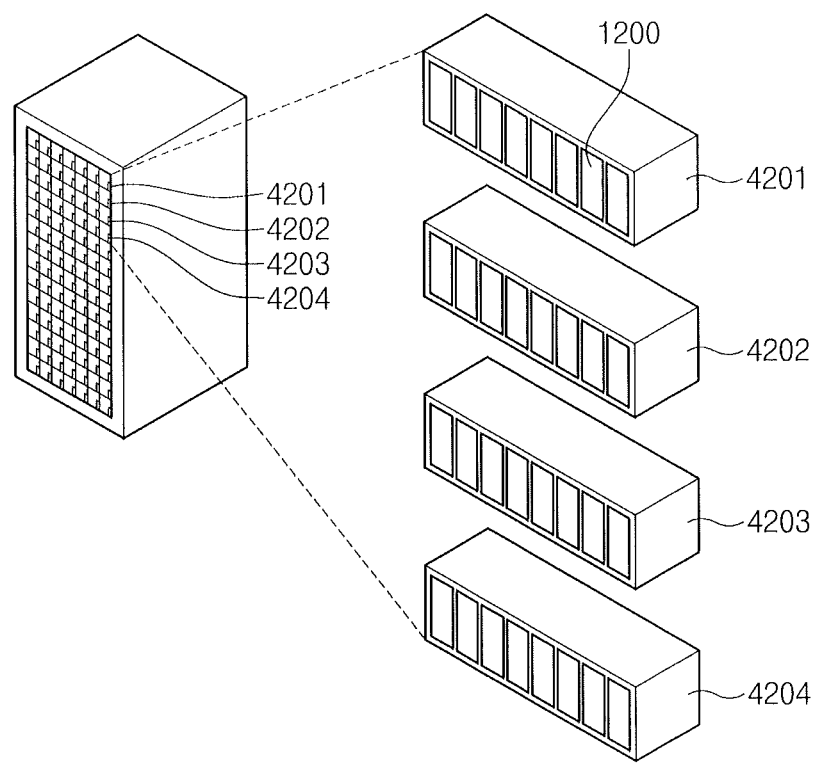
FIG. 13 is a block diagram showing a mass storage device illustrated in FIG. 12.

FIG. 13 is a diagram showing the mass storage device illustrated in FIG. 12.

Referring to FIG. 13, a mass storage device 4200 may be a storage server including a plurality of engines. For example, the mass storage device 4200 includes at least one or more engines, each of which has eight Disk Array Enclosures 4201 to 4204. Each DAE includes 15 data storage devices (for example, SSD) 1200. Accordingly, one engine has 120 data storage devices 1200. If the data storage device 4200 includes eight engines, it may include 960 data storage devices 1200.

The data storage device 1200 illustrated in FIG. 13 can be substantially identical to that illustrated, for example, in FIG. 1. Further, an inrush current reducing scheme applied at a power-on or hot plug operation can be substantially applied to the data storage device 1200 illustrated, for example, in FIG. 13.

As illustrated in FIG. 8, inrush current may be greater than current during normal operations. Further, inrush current generated when a data storage system 4000 in FIGS. 12 and 13 includes a plurality of, for example, 960 data storage devices 1200 may be multiplied many times. But, such inrush current may be also reduced effectively by the inrush current reducing scheme according to an exemplary embodiment of the inventive concept.

The mass storage device 4200 may be configured to charge a power storing circuit (for example, a super capacitor) of an auxiliary power supply within a data storage device 1200 after generating of inrush current, so that the influence due to the inrush current is reduced at a power-on operation or a hot plug operation. Since the power storing circuit is allowed to begin charging after the inrush current has already occurred, it is possible to prevent higher power consumption by the data processing system 4000 at power-on or hot plug operation. As a result, it is possible to prevent an unexpected system failure and to provide a secure and stable operations of the data processing system 4000.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of operating a data storage device comprising:
   hot plugging a data storage device including a semiconductor memory as a main storage unit to supply a first power and a second power to the data storage device;
   supplying the second power to an auxiliary power supply of the data storage device via a delay unit, wherein the delay unit comprises a timer circuit configured to delay for a predetermined time of at least 620 milliseconds and is further configured to:
     decouple the second power from the auxiliary power supply for the predetermined time; and
     couple the second power to the auxiliary power supply after the predetermined time has elapsed;
   supplying the first power to internal elements of the data storage device resulting in an in-rush current in the first power from the hot plugging, where the first power bypasses the delay unit without intervention;
   beginning charging the auxiliary power supply with the second power after the second power is applied to the data storage device and after the predetermined time has elapsed so that the in-rush current resulting from the hot plugging has passed before beginning the charging of the auxiliary power supply; and supplying power from the auxiliary power supply to the internal elements of the data storage device upon a loss of power to the data storage device.

2. The method of claim 1, wherein beginning charging an auxiliary power supply comprises blocking the second power to the auxiliary power supply until after the in-rush current has passed.

3. The method of claim 1, wherein beginning charging an auxiliary power supply is performed after supplying the first power to the internal elements of the data storage device.

4. The method of claim 1, wherein the first power and the second power comprise different voltage levels for respective on states for the first and second powers.

5. The method of claim 4, wherein the first power and the second power are separately supplied over a connector to the data storage device.

6. The method of claim 1, wherein the first power and the second power comprise equal voltage levels for respective on states for the first and second powers.

7. The method of claim 1 wherein the predetermined time is configured to prevent the in-rush current and the beginning of charging of the auxiliary power supply from overlapping in time.

8. The method of claim 1 wherein the predetermined time is measured relative to the powering on or the hot plugging of the data storage device.

9. The method of claim 1 wherein the data storage device comprises a plurality of auxiliary power supplies.

10. The method of claim 9 wherein the predetermined time is irrespective of a number of the plurality of auxiliary power supplies.

11. The method of claim 1 wherein the second power is generated within the data storage device from the first power.

12. The method of claim 1 wherein the semiconductor memory comprises a nonvolatile memory.

13. The method of claim 1 wherein the data storage device comprises a solid state disk.

14. The method of claim 1 wherein the predetermined time is measured relative to the supplying the first power to the internal elements of the data storage device.

15. The method of claim 1, wherein disconnecting the second power from the auxiliary power supply comprises decoupling a voltage signal associated with the second power from a super capacitor of the auxiliary power supply.

16. The method of claim 1, wherein the timer circuit comprises a 555 timer integrated circuit.

17. A method of operating a data storage device comprising:

hot plugging a data storage device including a semiconductor memory as a main storage unit to supply a first power and a second power to the data storage device;

supplying the second power to an auxiliary power supply of the data storage device via a delay unit, wherein the delay unit comprises a timer circuit configured to delay for a predetermined time of at least 620 milliseconds and is further configured to:

decouple the second power from the auxiliary power supply for the predetermined time; and couple the second power to the auxiliary power supply after the predetermined time has elapsed;

supplying the first power to internal elements of the data storage device resulting in an in-rush current in the first power from the hot plugging, where the first power bypasses the delay unit without intervention; and beginning charging the auxiliary power supply with the second power responsive to the elapsed predetermined time that is configured to substantially avoid overlapping the charging of the auxiliary power supply with the in-rush current.

18. The method of claim 1 wherein the predetermined time is configured by adjusting elements of the timer circuit.

19. The method of claim 18, wherein adjusting elements of the timer circuit comprises adjusting the value of a resistor element or a capacitor element of the timer circuit.

* * * * *